United States Patent
Li et al.

(10) Patent No.: US 12,289,943 B2
(45) Date of Patent: Apr. 29, 2025

(54) DOT LIGHT EMITTING DEVICE, DISPLAY APPARATUS AND MANUFACTURING METHOD

(71) Applicants: Beijing BOE Technology Development Co., Ltd., Beijing (CN); BOE Technology Group Co., Ltd., Beijing (CN)

(72) Inventors: Dong Li, Beijing (CN); Yichi Zhang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 833 days.

(21) Appl. No.: 17/465,698

(22) Filed: Sep. 2, 2021

(65) Prior Publication Data
US 2022/0140271 A1    May 5, 2022

(30) Foreign Application Priority Data
Oct. 30, 2020    (CN) .......................... 202011193294.6

(51) Int. Cl.
*H10K 50/115*    (2023.01)
*C09K 11/06*    (2006.01)
*H10K 85/30*    (2023.01)

(52) U.S. Cl.
CPC ............ *H10K 50/115* (2023.02); *C09K 11/06* (2013.01); *H10K 85/322* (2023.02); *H10K 85/342* (2023.02); *H10K 85/371* (2023.02); *C09K 2211/1018* (2013.01); *C09K 2211/1029* (2013.01); *C09K 2211/1044* (2013.01); *C09K 2211/185* (2013.01); *C09K 2211/188* (2013.01)

(58) Field of Classification Search
CPC ....... H10K 50/115; H10K 85/30; H10K 71/20
See application file for complete search history.

(56) References Cited

U.S. PATENT DOCUMENTS

| | | |
|---|---|---|
| 2010/0108984 A1 | 5/2010 | Cho et al. |
| 2014/0264196 A1 | 9/2014 | Werner et al. |
| 2018/0062101 A1 | 3/2018 | Li et al. |
| 2019/0296241 A1 | 9/2019 | Chen et al. |
| 2020/0044174 A1* | 2/2020 | Li ........................ H10K 85/344 |
| 2020/0313037 A1 | 10/2020 | He et al. |

(Continued)

FOREIGN PATENT DOCUMENTS

| | | |
|---|---|---|
| CN | 105051152 A | 11/2015 |
| CN | 108447999 A | 8/2018 |
| CN | 109233801 A | 1/2019 |

(Continued)

OTHER PUBLICATIONS

Machine Translation of CN109994655A (Year: 2019).*

(Continued)

*Primary Examiner* — Jenna N Chandhok
(74) *Attorney, Agent, or Firm* — IPro, PLLC (57) ABSTRACT

Disclosed are a quantum dot material, a quantum dot light emitting device, a display apparatus and a manufacturing method. The quantum dot material includes: a quantum dot, an anionic ligand, and a linking group linking the quantum dot and the anionic ligand, wherein the anionic ligand is configured to bind to a ring molecule by electrostatic force.

14 Claims, 4 Drawing Sheets

(56) References Cited

U.S. PATENT DOCUMENTS

2021/0253948 A1    8/2021  Zhang

FOREIGN PATENT DOCUMENTS

| | | | | |
|---|---|---|---|---|
| CN | 109904335 A | | 6/2019 | |
| CN | 109994655 A | * | 7/2019 | |
| CN | 110137387 A | | 8/2019 | |
| CN | 110289363 A | | 9/2019 | |
| CN | 110835529 A | | 2/2020 | |
| CN | 108963098 B | * | 4/2020 | ......... H01L 51/0085 |
| CN | 111548785 A | | 8/2020 | |
| WO | 2018233355 A1 | | 12/2018 | |

OTHER PUBLICATIONS

Lai, Shoujun, and Xiaolin Guan. "Surface modification and application of quantum dots based on polymers." Progress in Chemistry 23.5 (2011): 941.
CN 202011193294.6 second office action.

* cited by examiner

DOT LIGHT EMITTING DEVICE, DISPLAY APPARATUS AND MANUFACTURING METHOD

CROSS-REFERENCE TO RELATED APPLICATION

This application is based on and claims priority under 35 U.S.C 119 to Chinese Patent Application No. 202011193294.6, filed on Oct. 30, 2020, in the China National Intellectual Property Administration. The entire disclosure of the above application is incorporated herein by reference.

FIELD

The present disclosure relates to the technical field of semiconductors, in particular to a quantum dot material, a quantum dot light emitting device, a display apparatus and a manufacturing method.

BACKGROUND

As a new type of light emitting material, quantum dots (QD) have the advantages of high light color purity, high light emitting quantum efficiency, adjustable light emitting color, long service life, etc. They have become the current research hotspot of new LED light emitting materials. Therefore, quantum dot light emitting diodes (QLEDs) using quantum dot materials as a light emitting layer have become the main research direction of new display devices.

Active matrix quantum dot light emitting diodes (AMQLEDs) have also received more and more attention due to their potential advantages in wide color gamut and long life. Their research is getting deeper and their quantum efficiency is continuously improving, and they have basically reached the level of industrialization. The further use of new processes and technologies to achieve their industrialization has become a future trend.

SUMMARY

An embodiment of the present disclosure provides a quantum dot material, including: a quantum dot, an anionic ligand, and a linking group linking the quantum dot and the anionic ligand, wherein the anionic ligand is configured to bind to a ring molecule by an electrostatic force.

In a possible implementation, the ring molecule includes hydrogen atoms, and the anionic ligand is configured to bind to the hydrogen atoms by the electrostatic force.

In a possible implementation, the quantum dot material further includes a cationic ligand matched with the anionic ligand, wherein the cationic ligand is configured to balance a charge of the anionic ligand.

In a possible implementation, the cationic ligand includes one or a combination of:

$NH_4^+$; and $Na^+$.

In a possible implementation, the anionic ligand is one of:

-continued

ClO$_4^-$; Cl$^-$; PF$_6^-$; and BF$_3^-$.

In a possible implementation, the linking group includes one or a combination of:
—SH—;
—COOH—; and
—NH$_2$—;

An embodiment of the present disclosure further provides a quantum dot light emitting device, including: a base substrate, a functional layer located on a side of the base substrate, a quantum dot film layer located on a side, facing away from the base substrate, of the functional layer, and a connecting layer located between the functional layer and the quantum dot film layer, wherein the quantum dot film layer includes a patterned region;
the quantum dot film layer in the patterned region includes the quantum dot material provided by embodiments of the present disclosure; and
a region, corresponding to the patterned region, of the connecting layer includes: a ring molecule, a first structure connected with the ring molecule, and a connecting structure connecting the first structure and the functional layer, wherein the ring molecule and an anionic ligand bind by electrostatic force, and the first structure is configured to connect or disconnect the ring molecule and the connecting structure under preset conditions.

In a possible implementation, the ring molecule has hydrogen atoms through which the ring molecule binds to the anionic ligand by the electrostatic force.

In a possible implementation, the first structure is a photodegradable group configured to disconnect the ring molecule from the connecting structure under ultraviolet irradiation.

In a possible implementation, the photodegradable group includes: carbonyl or epoxy group.

In a possible implementation, the first structure includes a structure formed after a first photocurable group and a second photocurable group are cross-linked with each other by ultraviolet irradiation, the first photocurable group is connected to the ring molecule, and the second photocurable group is connected to the connecting structure.

In a possible implementation, the first photocurable group is identical to the second photocurable group.

In a possible implementation, the first photocurable group includes one or a combination of:
alkenyl;
alkynyl; and
cyano.

In a possible implementation, the ring molecule includes a ring molecule structure composed of n repeating units connected in sequence, wherein $4 \leqslant n \leqslant 10$.

In a possible implementation, the ring molecule includes: a polymer of styrene or a polymer of a styrene derivative.

In a possible implementation, the ring molecule structure is wherein $4 \leqslant n \leqslant 10$; the ring molecule is of a following structure:

In a possible implementation, the connecting structure includes: a silyl chain, or a siloxanyl chain; the connecting structure further includes a structure formed by binding one or a combination of following groups connected to a silicon atom with the functional layer:
—Cl;
—OCH$_3$; and
—OH.

An embodiment of the present disclosure further provides a display apparatus, including the quantum dot light emitting device provided by embodiments of the present disclosure.

An embodiment of the present disclosure further provides a manufacturing method of the quantum dot light emitting device provided by embodiments of the present disclosure, including:

providing a base substrate;
forming a functional layer on a side of the base substrate;
forming a connecting layer on a side, facing away from the base substrate, of the functional layer, wherein the connecting layer includes: a ring molecule, a first structure connected with the ring molecule, and a connecting structure connecting the first structure and the functional layer;
forming a quantum dot film on a side, facing away from the functional layer, of the connecting layer, wherein the quantum dot film includes: a quantum dot, an anionic ligand, and a linking group linking the quantum dot and the anionic ligand; and
treating the quantum dot film and the connecting layer under preset conditions to form a patterned quantum dot film layer;
the first structure includes a structure formed after a first photocurable group and a second photocurable group are cross-linked with each other by ultraviolet radiation, the first photocurable group is connected to the ring molecule, and the second photocurable group is connected to the connecting structure; and the treating the quantum dot film and the connecting layer under the preset conditions to form the patterned quantum dot film layer includes:
shielding a region where the quantum dot film is removed, and performing ultraviolet irradiation to make the first photocurable group and the second photocurable group of an irradiated region cross-linked, so as to reserve a quantum dot film in the irradiated region;
the forming the connecting layer on the side, facing away from the base substrate, of the functional layer includes:
forming a first sub-connecting layer on the side, facing away from the base substrate, of the functional layer, wherein the first sub-connecting layer includes the connecting structure and the second photocurable group connected with the connecting structure; and
forming a second sub-connecting layer on a side, facing away from the functional layer, of the first sub-connecting layer, wherein the second sub-connecting layer includes the ring molecule and the first photocurable group connected with the ring molecule;
after the quantum dot film and the connecting layer are treated under the preset conditions to form the patterned quantum dot film layer, the manufacturing method further includes:
reusing the first sub-connecting layer that is not removed from the shielded region currently as a first sub-connecting layer to manufacture a quantum dot film of a next emergent light color;
the first structure is a photodegradable group; and the treating the quantum dot film and the connecting layer under the preset conditions to form the patterned quantum dot film layer includes:
shielding a region where the quantum dot film is reserved, and performing ultraviolet irradiation to decompose the photodegradable group in an irradiated region and disconnect the ring molecule from the connecting structure, so as to remove the quantum dot film in the irradiated region;
the forming the connecting layer on the side, facing away from the base substrate, of the functional layer includes:
forming the connecting layer including the ring molecule, the photodegradable group and the connecting structure on the side, facing away from the base substrate, of the functional layer.

DETAILED DESCRIPTION OF THE EMBODIMENTS

In order to make the objectives, technical solutions, and advantages of the embodiments of the present disclosure clearer, the technical solutions of the embodiments of the present disclosure will be clearly and fully described in combination with the accompanying drawings of the embodiments of the present disclosure. It is apparent that the described embodiments are some, but not all, embodiments of the present disclosure. Based on the described embodiments of the present disclosure, all other embodiments attainable by those ordinary skilled in the art without involving any inventive effort are within the scope of the present disclosure.

Unless otherwise defined, the technical terms or scientific terms used in the present disclosure shall have the usual meanings understood by those with ordinary skills in the field to which the present disclosure belongs. "First", "second" and similar words used in the present disclosure do not indicate any order, quantity or importance, but are only used to distinguish different components. "Comprise" or "include" or other similar words mean that the element or item appearing before the word covers elements or items listed after the word and their equivalents, but does not exclude other elements or items. "Connecting" or "connected" or other similar words are not limited to physical or mechanical connections, but may include electrical connections, whether direct or indirect. The terms "upper", "lower", "left", "right" and the like are used merely to denote a relative positional relationship that may change accordingly when the absolute position of the object being described changes.

In order to keep the following description of embodiments of the present disclosure clear and concise, the present disclosure omits detailed descriptions of known functions and known components.

Figure 1:
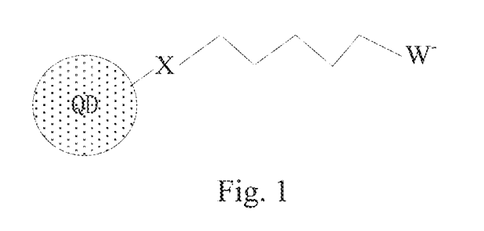
FIG. 1 is a schematic structural diagram of a quantum dot material provided by an embodiment of the present disclosure.
Figure 6:
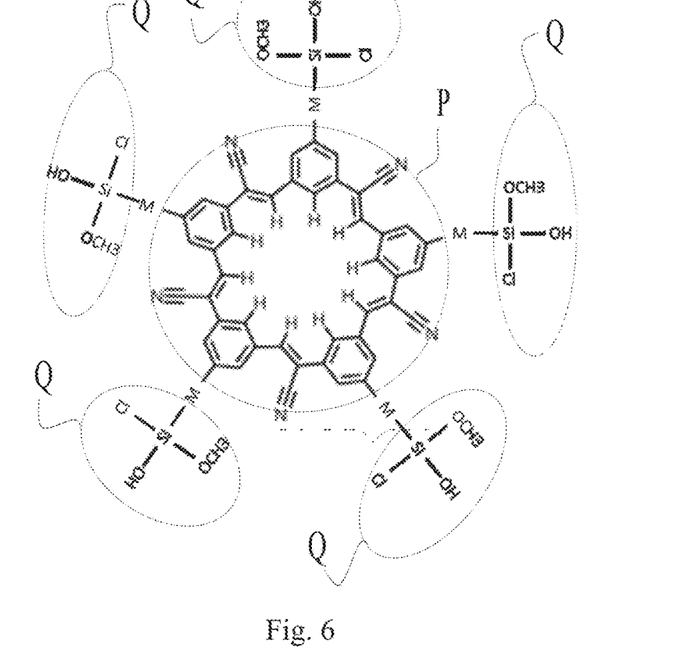
FIG. 6 is a schematic structural diagram of a connecting layer provided by an embodiment of the present disclosure.

Referring to FIG. 1, an embodiment of the present disclosure provides a quantum dot material, including: a quantum dot QD, an anionic ligand W⁻, and a linking group X linking the quantum dot QD and the anionic ligand W⁻, wherein the anionic ligand W⁻ is configured to bind to a ring molecule P (as shown in FIG. 6) by electrostatic force. Optionally, the ring molecule P contains hydrogen atoms inside, and the anionic ligand W⁻ may bind to the hydrogen atoms in the ring molecule P by electrostatic force.

In some embodiments of the present disclosure, the anionic ligand W⁻ is negatively charged, as shown in FIG. 6, some hydrogen atoms on a molecular skeleton of the ring molecule P are concentrated in a ring, electrons contributed by the hydrogen atoms are mostly carbon atoms in the ring molecule P, and the ring molecule P is in a low-electron state, so that a region in the ring is an electron-deficient space. The region may capture some electron-rich compounds or anions, and generate close binding force with them through the electrostatic force (Coulomb interaction). The region may bind to the anionic ligand W⁻, so that when a pattern of a quantum dot film layer of a quantum dot light emitting device is formed through the quantum dot material, a connecting layer is firstly formed, and the connecting layer includes the ring molecule with the hydrogen atoms, a first structure connected with the ring molecule, and a connecting structure connecting the first structure and a functional layer of a base substrate. Because the hydrogen atoms of the ring molecule and the anionic ligand of the quantum dot material bind, and are connected or disconnected by the first structure under preset conditions, the quantum dot material in part of a region may be removed as required, while the quantum dot material in part of the region may be reserved, thereby realizing patterning of quantum dots, and solving the problems of limited patterning of the quantum dots and low resolution of the quantum dot light emitting device during ink-jet printing.

Figure 2:
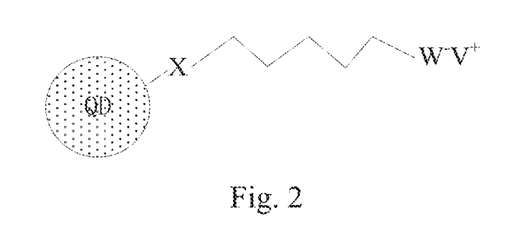
FIG. 2 is a schematic structural diagram of another quantum dot material provided by an embodiment of the present disclosure.

In some embodiments, as shown in FIG. 2, the quantum dot material further includes a cationic ligand V⁺ matched with the anionic ligand W⁻, and the cationic ligand V⁺ is configured to balance the charge of the anionic ligand W⁻. Optionally, the cationic ligand V⁺ includes one or a combination of:

$NH_4^+$, and $Na^+$.

In some embodiments, the anionic ligand W⁻ is one of:

ClO$_4^-$; Cl$^-$; PF$_6^-$; and BF$_3^-$.

In some embodiments, the linking group X includes one or a combination of —SH—, —COOH—, and —NH$_2$—.

In order to more clearly understand the quantum dot light emitting material provided by embodiments of the present disclosure, the following detailed description is given.

Figure 3:
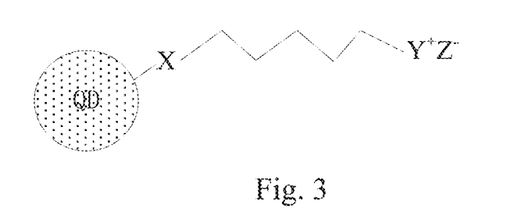
FIG. 3 is a schematic structural diagram of a specific quantum dot material provided by an embodiment of the present disclosure.
Figure 4:
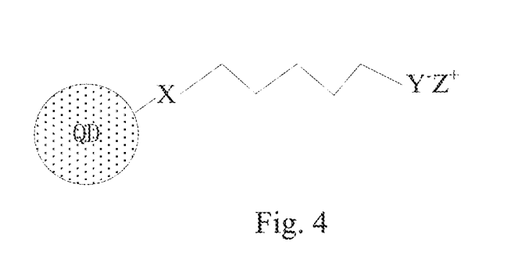
FIG. 4 is a schematic structural diagram of another specific quantum dot material provided by an embodiment of the present disclosure.

The quantum dot material in embodiments of the present disclosure adopts a ligand containing an ionic complex. The structure of the ligand is as shown in FIGS. 3 and 4, and its two ends contain two groups, namely —X and —YZ. X serves as the linking group, and may be —SH—, —COOH—, —NH2— and other groups that may bind to the quantum dots. Y is a group containing an anionic (or cationic) complex, and Z is a counter ion of Y and mainly plays a role in charge balance. The anionic (or cationic) complex may optionally be an organometallic complex, wherein part of the complex may be an organic complex of rare earth metals (such as Ir, La, Nd and Eu) and other metals (such as Cu, In, Pb and Pt). The organic complex may be: o-phenanthroline, 2-phenylpyridine, phenyloxadiazole pyridine, fluorophenylpyridine, bipyridine, etc. and their derivatives, and binds to the metals to form the cationic complex (Y$^+$), for example, , or The organic complex may further be tetrakis(pentafluorophenyl)boronic acid, tetrakis[(trifluoromethyl)phenyl]boronic acid, tetrakis[bis(trifluoromethyl)phenyl]boronic acid, hexa(pentafluorophenyl)phosphoric acid, hexa[trifluoromethyl)phenyl]phosphoric acid, hexa[bis(trifluoromethyl)phenyl]phosphoric acid, etc. and their derivatives, and binds to metals to form the anionic complex (Y$^-$), for example, If the cationic complex Y$^+$ is selected, its counter anion Z may be a great-steric-hindrance anionic complex, or small molecules such as $ClO_4^-$, $Cl^-$, $PF_6^-$ and $BF_3^-$, at this moment, $Z^-$ may be used as the anionic ligand $W^-$ that binds to protons in the ring molecule, and $Y^+$ is used as the cationic ligand $V^+$. If the anionic complex $Y^-$ is selected, its counter cation Z may be a great-steric-hindrance cationic complex, or small molecules such as $NH_4^+$ and $Na^+$, at this moment, $Y^-$ may be used as the anionic ligand $W^-$ that binds to the protons in the ring molecule, and $Z^+$ is used as the cationic ligand $V^+$.

Figure 5:
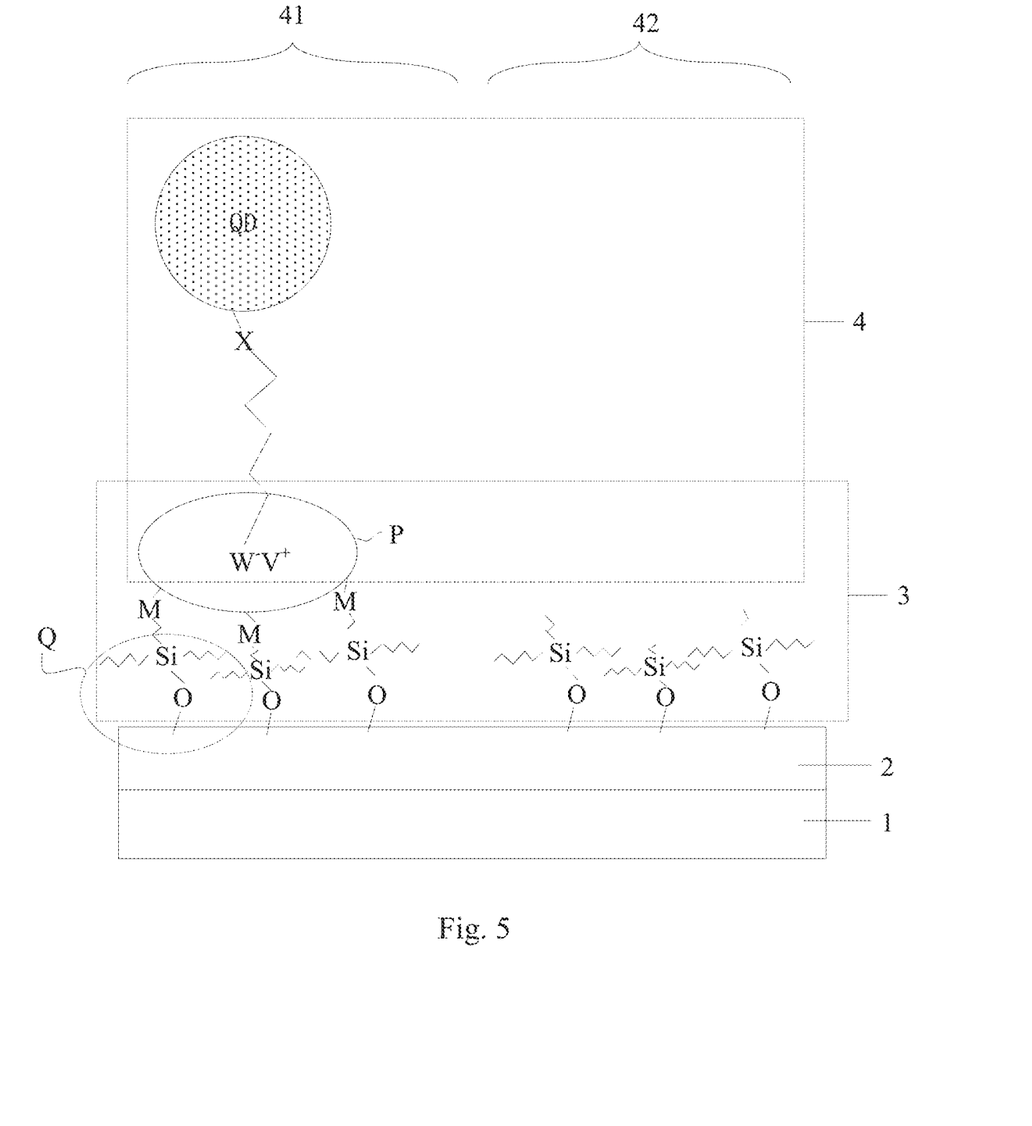
FIG. 5 is a schematic structural diagram of a quantum dot light emitting device provided by an embodiment of the present disclosure.

Based on the same inventive concept, an embodiment of the present disclosure further provides a quantum dot light emitting device, as shown in FIGS. 5 and 6, wherein FIG. 6 is an enlarged structural schematic diagram of a connecting layer 3. The quantum dot light emitting device includes: a base substrate 1, a functional layer 2 located on one side of the base substrate 1, a quantum dot film layer 4 located on a side, facing away from the base substrate 1, of the functional layer 2, and the connecting layer 3 located between the functional layer 2 and the quantum dot film layer 4. The quantum dot film layer 4 includes a patterned region 41 and a removed region 42.

The quantum dot film layer 4 in the patterned region 41 includes the quantum dot material provided by embodiments of the present disclosure. That is, the quantum dot material includes: a quantum dot QD, an anionic ligand $W^-$, and a linking group X linking the quantum dot QD and the anionic ligand $W^-$, wherein the anionic ligand $W^-$ is configured to bind to hydrogen atoms in a ring molecule.

A region, corresponding to the patterned region 41, of the connecting layer 3 includes: the ring molecule P, a first structure M connected with the ring molecule P, and a connecting structure Q connecting the first structure M and the functional layer 2. The ring molecule P and the anionic ligand $W^-$ bind by electrostatic force, and the first structure M is configured to connect or disconnect the ring molecule P and the connecting structure Q under preset conditions. Optionally, the ring molecule P has the hydrogen atoms through which the ring molecule P binds to the anionic ligand $W^-$ by the electrostatic force.

In some embodiments, the connecting layer 3 is formed on the side, facing away from the base substrate, of the functional layer, the connecting layer 3 includes: the ring molecule P with the hydrogen atoms, the first structure M connected with the ring molecule P, and the connecting structure Q connecting the first structure M and the functional layer 2, protons in the ring molecule P may bind to the anionic ligand $W^-$ of the quantum dot material, the first structure M may connect or disconnect the ring molecule P and the connecting structure Q under preset conditions, and therefore the quantum dot material in part of the region may be removed while the quantum dot material in part of the region may be reserved as required, thereby realizing patterning of quantum dots, and solving the problems of limited patterning of the quantum dots and low resolution of the quantum dot light emitting device during ink-jet printing.

In some embodiments, a first electrode layer (not shown in the figures) may be disposed between the functional layer 2 and the base substrate 1, and a second electrode layer (not shown in the figures) may be disposed on a side, facing away from the connecting layer 3, of the quantum dot film layer 4. Optionally, the first electrode layer may be a cathode, and the second electrode layer may be an anode. The functional layer 2 may be an electron transport layer, and a material of the electron transport layer may be zinc oxide. The surface of zinc oxide may contain groups such as —OH and —O. The removed region 42 may be a region where a quantum dot film of the current emergent light color needs to be removed in the patterning process of the quantum dot film of one emergent light color. The removed region 42 may be used to manufacture a quantum dot pattern of the next emergent light color.

Figure 7:
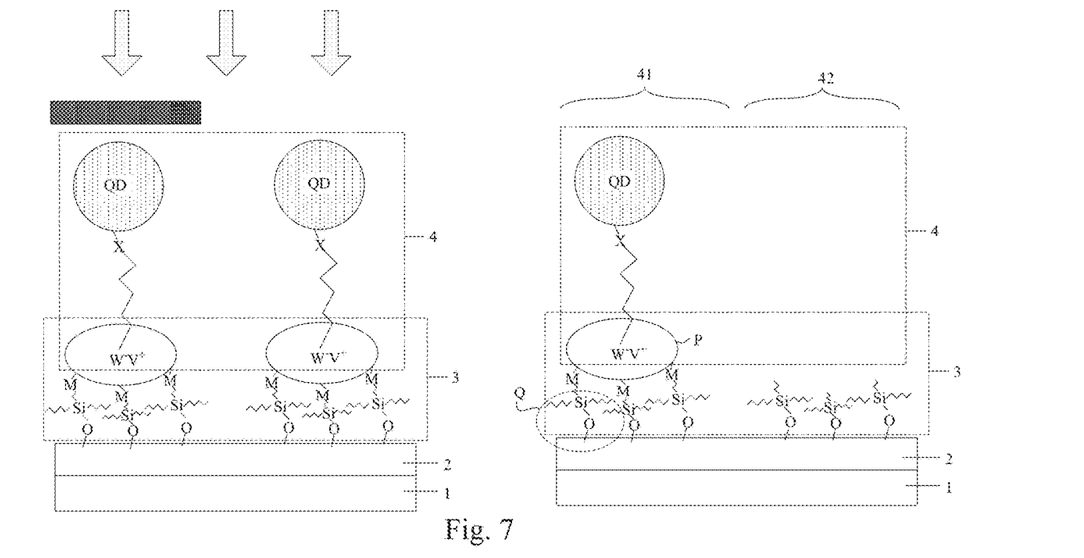
FIG. 7 is a schematic diagram of manufacturing of a quantum dot light emitting device provided by an embodiment of the present disclosure.

In some embodiments, as shown in FIG. 7, the first structure M is a photodegradable group, and the photodegradable group is configured to disconnect the ring molecule P from the connecting structure Q under ultraviolet irradiation. Optionally, the photodegradable group includes: carbonyl or epoxy group. In the embodiment of the present disclosure, since the first structure M is the photodegradable group, when the quantum dot film is patterned, the region where the quantum dot film needs to be reserved (as the patterned region 41 in FIG. 7) may be shielded through a mask, while the region where the quantum dot film needs to be removed (as the removed region 42 in FIG. 7) may be exposed to ultraviolet irradiation. After the ultraviolet irradiation, in the region where the quantum dot film needs to be reserved (as the patterned region 41 in FIG. 7), the first structure M has no broken bond, and the quantum dot film is reserved; while in the region where the quantum dot film needs to be removed (as the removed region 42 in FIG. 7), the first structure M has a broken bond, and the quantum dot film is removed, thereby realizing the patterning of the quantum dot film.

Figure 8:
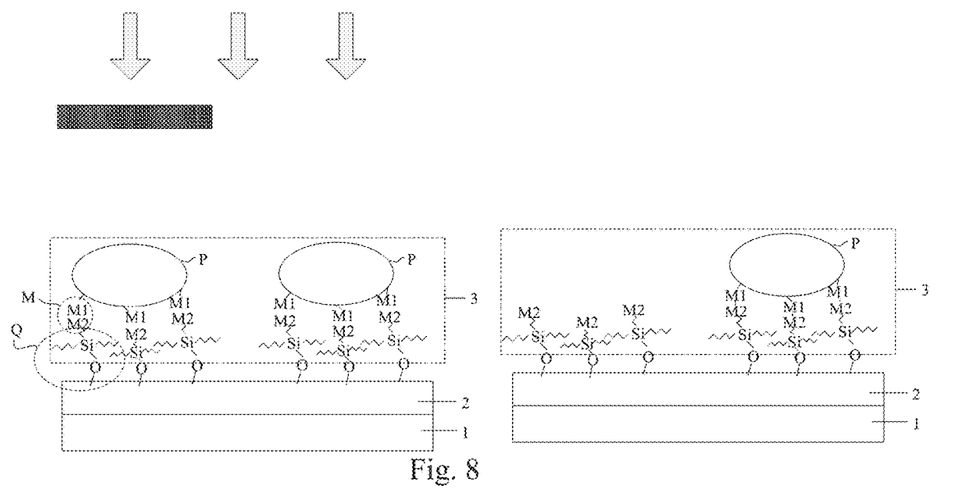
FIG. 8 is a schematic diagram of manufacturing of another quantum dot light emitting device provided by an embodiment of the present disclosure.

In some embodiments, as shown in FIG. 8, the first structure M includes a structure formed after a first photocurable group M1 and a second photocurable group M2 are cross-linked with each other under ultraviolet irradiation, wherein the first photocurable group M1 is connected to the ring molecule P, and the second photocurable group M2 is connected to the connecting structure Q. Optionally, the first photocurable group M1 and the second. photocurable group M2 are the same. Optionally, the first photocurable group M1 includes one or a combination of the following: alkenyl, alkynyl; and cyano. In the embodiment of the present disclosure, since the first structure M includes the structure formed after the first photocurable group M1 and the second photocurable group M2 are cross-linked with each other under ultraviolet irradiation, when the quantum dot film is patterned, the region where the quantum dot film needs to be reserved may be exposed to ultraviolet irradiation, while the region where the quantum dot film needs to be removed may be shielded by a mask. After the ultraviolet irradiation, in the region where the quantum dot film needs to be reserved, the first photocurable group M1 and the second photocurable group M2 are cross-linked with each other, and the quantum dot film is cured and cross-linked, and is reserved; while in the region where the quantum dot film needs to be removed, the first photocurable group M1 and the second photocurable group M2 are not cross-linked with each other, the first photocurable group M1 connected with the ring molecule P and the quantum dot QD may be cleaned and removed in the subsequent cleaning process, and then the quantum dot film is also removed, thereby realizing the patterning of the quantum dot film.

In some embodiments, the ring molecule P includes a ring molecule structure composed of n repeating units connected in sequence, where $4 \leq n \leq 10$. Optionally, the ring molecule P includes: a polymer of styrene or a polymer of a styrene derivative. Specifically, the ring molecule structure may be where $4 \leqslant n \leqslant 10$. Specifically, the ring molecule P is of the following structure:

where n=5. That is, the ring molecule P consists of a plurality of repeating units connected one by one to form a ring, with a hollow structure in the middle and containing more protons, so the ring molecule P may tightly bind to an anion.

In some embodiments, as shown in FIG. 6, the connecting structure Q includes: a silyl chain or a siloxanyl chain. Optionally, the connecting structure Q further includes a structure formed by binding one or a combination of following groups connected to the silicon atoms with the functional layer: —Cl; —OCH$_3$; and —OH, and a —Si—O— group is formed after binding to the functional layer. Optionally, the connecting structure Q may be one of silane derivatives containing the silyl chain or the siloxanyl chain at the end of a side chain of the ring molecule P, and Si—Cl, Si—OH, Si—OCH$_3$ and the like at one end of a silicon oxygen bond may directly bind to —OH, —O and other groups on the surface of the zinc oxide functional layer 2.

Based on the same inventive concept, an embodiment of the present disclosure further provides a display apparatus, including the quantum dot light emitting device provided by the embodiment of the present disclosure.

Figure 9:
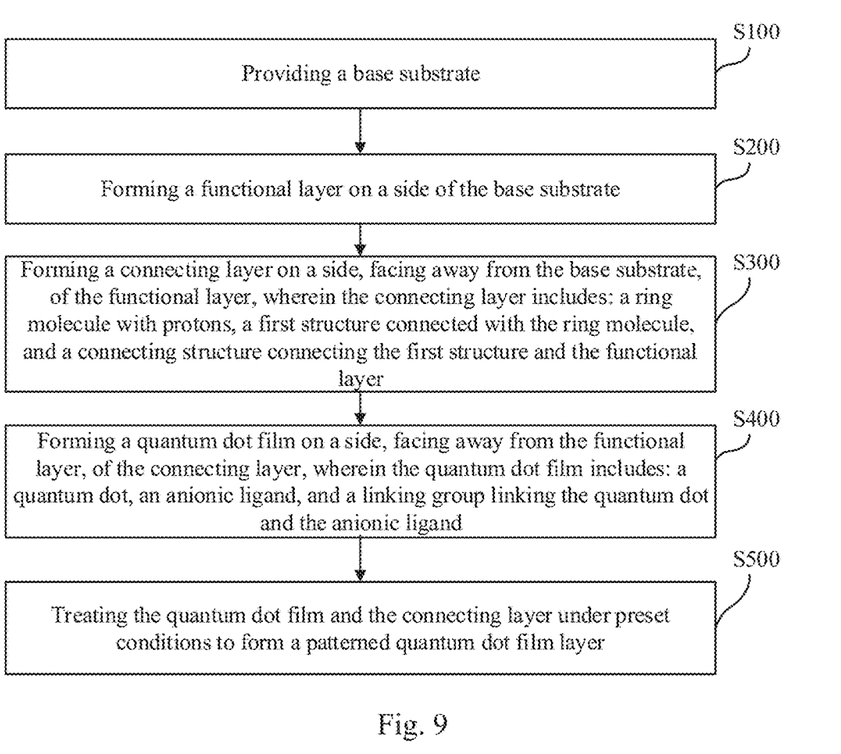
FIG. 9 is a schematic diagram of a manufacturing process of a quantum dot light emitting device provided by an embodiment of the present disclosure.

Based on the same inventive concept, referring to FIG. 9, an embodiment of the present disclosure further provides a manufacturing method of the quantum dot light emitting device provided in embodiments of the present disclosure. The method includes:

S100, a base substrate is provided;

S200, a functional layer is formed on one side of the base substrate;

S300, a connecting layer is formed on one side, facing away from the base substrate, of the functional layer, wherein the connecting layer includes: a ring molecule, a first structure connected with the ring molecule, and a connecting structure connecting the first structure and the functional layer;

S400, a quantum dot film is formed on a side, facing away from the functional layer, of the connecting layer, wherein the quantum dot film includes: a quantum dot, an anionic ligand, and a linking group linking the quantum dot and the anionic ligand; and S500, treating the quantum dot film and the connecting layer under preset conditions to form a patterned quantum dot film layer.

In some embodiments, the first structure M is a photodegradable group. For step S500, treating the quantum dot film and the connecting layer under the preset conditions to form the patterned quantum dot film layer includes: the region where the quantum dot film is reserved is shielded, and ultraviolet irradiation is performed to decompose the photodegradable group in an irradiated region and disconnect the ring molecule from the connecting structure, so as to remove the quantum dot film. Correspondingly, for step S300, forming the connecting layer on the side, facing away from the base substrate, of the functional layer includes: the connecting layer including the ring molecule, the photodegradable group and the connecting structure is formed on the side, facing away from the base substrate, of the functional layer. That is, the connecting layer containing the ring molecule, the photodegradable group, and the connecting structure may be directly formed in one step.

In some embodiments, the first structure M includes a structure formed after a first photocurable group and a second photocurable group are cross-linked with each other under ultraviolet irradiation, wherein the first photocurable group is connected to the ring molecule, and the second photocurable group is connected to the connecting structure. For step S500, treating the quantum dot film and the connecting layer under the preset conditions to form the patterned quantum dot film layer includes: the region where the quantum dot film is removed is shielded, and ultraviolet irradiation is performed to make the first photocurable group and the second photocurable group in the irradiated region cross-linked, so as to reserve the quantum dot film. Correspondingly, for step S300, forming the connecting layer on the side, facing away from the base substrate, of the functional layer includes: forming a first sub-connecting layer on the side, facing away from the base substrate, of the functional layer, wherein the first sub-connecting layer includes the connecting structure and the second photocurable group connected with the connecting structure; and a second sub-connecting layer is formed on a side, facing away from the functional layer, of the first sub-connecting layer, wherein the second sub-connecting layer includes the ring molecule and the first photocurable group connected with the ring molecule. That is, the connecting layer may be formed in two steps. Correspondingly, after step S500, namely after the quantum dot film and the connecting layer are treated under the preset conditions to form the patterned quantum dot film layer, the manufacturing method further includes: the first sub-connecting layer that is not removed from the shielded region currently is reused as a first sub-connecting layer to manufacture a quantum dot film of a next emergent light color. That is, in the region where the quantum dot film needs to be removed (namely the shielded region in the manufacturing process of the quantum dot film of the current emergent light color), the connecting structure Q connected with the functional layer 2 and the second photocurable group M2 connected with the connecting structure Q may be reserved, and reused as a structure to manufacture the next type of quantum dot film, thereby simplifying the process steps.

In order to more clearly understand the manufacturing method of the quantum dot light emitting device provided by embodiments of the present disclosure, the following detailed description is given.

In some embodiments, the quantum dot light emitting device is manufactured in a mode that a cationic complex $Y^+$ is used, its counter anion is $PF_6^-$ and $ClO_4^-$, the ring molecule P is formed by connecting n repeating units, where n=5, and the first structure M adopts the photodegradable group, as shown in FIG. 7.

Step 1, a first electrode layer is deposited on a specific base substrate 1, wherein the base substrate 1 may be glass or a flexible PET substrate, and the first electrode layer may be transparent ITO, FTO, a conductive polymer, etc., or an opaque metal electrode such as Al and Ag, and is used as a cathode layer.

Step 2, ZnO or an Mg, Al, Zr or Y doped ZnO film is deposited on the first electrode layer by magnetron sputtering as an electron transport layer (functional layer 2), wherein the thickness of the electron transport layer of each sub-pixel may be deposited as required, the thickness is 50 nm-300 nm.

Step 3, the connecting layer 3 is prepared, a silane derivative containing the ring molecule P is dissolved in tetrahydrofuran (THF), mixed with hydrochloric acid, stirred for use, filtered with a polytetrafluoroethylene (PTFE) filter membrane before preparation, and diluted in epoxy hexane; and the prepared solution is dropped on a surface with the functional layer 2 formed thereon, or, the base substrate 1 with the functional layer 2 formed thereon is soaked in the prepared solution; and after 5 min-20 min at a room temperature, the base substrate 1 is removed, and washed with epoxy hexane, so that the disconnected quantum dot QD and the remaining structure of the connecting layer 3 in the removed region 42 are washed away together.

Step 4, the quantum dot film (20 nm-50 nm) is deposited, wherein the quantum dot film may bind to the protons in the ring molecule P.

Step 5, the part where the quantum dot film needs to be reserved is shielded by adopting a photolithography process, the position irradiated by ultraviolet light (UV) may be washed away with a solvent because the ring molecule P is disconnected from the base substrate 1, and the position not irradiated by UV is reserved. Optionally, the remaining structure (such as the connecting structure Q) in the region irradiated by UV may be further removed, so as to manufacture the pattern of the quantum dot film of the next emergent light color in the region.

Step 6, quantum dot film layers with other emergent light colors are prepared using similar processes.

Step 7, a hole transport layer, a hole injection layer, and a second electrode layer are deposited in sequence, wherein the second electrode layer may be Al, Ag, etc., or, IZO may be deposited by magnetron sputtering with the thickness of 10 nm-100 nm.

In another possible embodiment, the quantum dot light emitting device is manufactured in a mode that a cationic complex $Y^+$ is adopted, its counter anion is $PF_6^-$, $ClO_4^-$, etc., the ring molecule P is formed by connecting n repeating units, where n=5, and the first structure M includes the first photocurable group M1 and the second photocurable group M2, as shown in FIG. 8.

Step 1, a first electrode layer is deposited on a specific base substrate 1, wherein the base substrate 1 may be glass or a flexible PET substrate, and the first electrode layer may be transparent ITO, FTO, a conductive polymer, etc., or an opaque metal electrode such as Al and Ag, and is used as a cathode layer.

Step 2, ZnO or an Mg, Al, Zr or Y doped ZnO film is deposited on the first electrode layer by magnetron sputtering as an electron transport layer (functional layer 2), wherein the thickness of the electron transport layer of each sub-pixel may be deposited as required, the thickness is 50 nm-300 nm.

Step 3, a layer of silane derivative (used as the connecting structure Q) of the silyl chain or the siloxanyl chain containing the second photocurable group M2, such as alkene, alkyne or cyano, at the tail end is deposited firstly; the silane derivative containing the ring molecule P is dissolved in tetrahydrofuran (THF), mixed with hydrochloric acid, stirred for later use, filtered with a polytetrafluoroethylene (PTFE) filter membrane before preparation, and diluted in epoxy hexane; the prepared solution is dropped on the surface of the base substrate 1 with the functional layer 2 formed thereon, or the base substrate 1 with the functional layer 2 formed thereon is soaked in the prepared solution; and after 5 min-20 min at a room temperature, the base substrate 1 is removed, and washed with epoxy hexane, and the unfixed ring molecule P and the remaining structure of the connecting layer 3 in the shielded region are washed away together.

Step 4, the connecting layer 3 is deposited. It should be noted that this step is only for film formation, no reaction condition exists, and the first photocurable group M1 and the second photocurable group M2 are cross-linked after the next step of ultraviolet irradiation.

Step 5, the part where the quantum dot film does not need to be deposited is shielded by adopting a photolithography process, the position irradiated by UV may not be washed away due to cross-linking between a side chain of the ring molecule P and the base substrate 1 with the functional layer 2 formed thereon, and the position not irradiated by UV may be washed away due to non-cross-linking. In the region where the quantum dot film needs to be removed in the manufacturing process of the quantum dot film of the current color (that is, the shielded region in the manufacturing process of the quantum dot film of the current emergent light color), the connecting structure Q connected with the functional layer 2 and the second photocurable group M2 connected with the connecting structure Q may be reserved, and reused as a first sub-connecting layer to manufacture the next type of quantum dot film, thereby simplifying the process steps.

Step 6, the quantum dot film (20 nm-50 nm) is deposited, wherein the quantum dot film may bind to the part where the ring molecule P is reserved.

Step 7, quantum dot film layers with other emergent light colors are prepared using similar processes.

Step 8, a hole transport layer, a hole injection layer, and a second electrode layer are deposited in sequence, wherein the second electrode layer may be Al, Ag, etc., or, IZO may be deposited by magnetron sputtering with the thickness of 10 nm-100 nm.

The beneficial effects of embodiments of the present disclosure are as follows: in embodiments of the present disclosure, the connecting layer 3 is formed on the side, facing away from the base substrate, of the functional layer, the connecting layer 3 includes: the ring molecule P, the first structure M connected with the ring molecule P, and the connecting structure Q connecting the first structure M and the functional layer 2, the ring molecule P can bind to the anionic ligand W⁻ of the quantum dot material by the electrostatic force, the first structure M may connect or disconnect the ring molecule P and the connecting structure Q under preset conditions, and therefore the quantum dot material in part of the region can be removed while the quantum dot material in part of the region can be reserved as required, thereby realizing patterning of the quantum dots, and solving the problems of the limited patterning of the quantum dots and the low resolution of the quantum dot light emitting device during ink-jet printing.

It will be apparent to those skilled in the art that various modifications and variations can be made in the present disclosure without departing from the spirit or scope of the present disclosure. Thus, it is intended that the present disclosure cover the modifications and variations provided they come within the scope of the appended claims and their equivalents.

What is claimed is:

1. A quantum dot light emitting device, comprising: a base substrate, a functional layer arranged on a side of the base substrate, a quantum dot film layer arranged on a side, facing away from the base substrate, of the functional layer, and a connecting layer arranged between the functional layer and the quantum dot film layer, wherein the quantum dot film layer comprises a patterned region;

the quantum dot film layer in the patterned region comprises a quantum dot material; and a region, corresponding to the patterned region, of the connecting layer comprises: a ring molecule, a first structure connected with the ring molecule, and a connecting structure connecting the first structure and the functional layer, wherein the ring molecule and an anionic ligand bind by the electrostatic force, and the first structure is configured to connect or disconnect the ring molecule and the connecting structure under preset conditions;

wherein the quantum dot material comprises: a quantum dot, an anionic ligand, and a linking group linking the quantum dot and the anionic ligand, wherein the anionic ligand is configured to bind to a ring molecule by an electrostatic force.

2. The quantum dot light emitting device according to claim 1, wherein the ring molecule has hydrogen atoms through which the ring molecule binds to the anionic ligand by the electrostatic force.

3. The quantum dot light emitting device according to claim 1, wherein the first structure is a photodegradable group configured to disconnect the ring molecule from the connecting structure under ultraviolet irradiation.

4. The quantum dot light emitting device according to claim 3, wherein the photodegradable group comprises: carbonyl or epoxy group.

5. The quantum dot light emitting device according to claim 1, wherein the first structure comprises a structure formed after a first photocurable group and a second photocurable group are cross-linked with each other by ultraviolet irradiation, the first photocurable group is connected to the ring molecule, and the second photocurable group is connected to the connecting structure.

6. The quantum dot light emitting device according to claim 5, wherein the first photocurable group is identical to the second photocurable group.

7. The quantum dot light emitting device according to claim 6, wherein the first photocurable group comprises one or a combination of:

alkenyl;

alkynyl; and cyano.

8. The quantum dot light emitting device according to claim 1, wherein the ring molecule comprises a ring molecule structure composed of n repeating units connected in sequence, wherein 4≤n≤10.

9. The quantum dot light emitting device according to claim 8, wherein the ring molecule comprises: a polymer of styrene or a polymer of a styrene derivative.

10. The quantum dot light emitting device according to claim 8, wherein the ring molecule structure is wherein the ring molecule is of a following structure:

11. The quantum dot light emitting device according to claim 1, wherein the connecting structure comprises: a silyl chain, or a siloxanyl chain;

wherein the connecting structure further comprises a structure formed by binding one or a combination of following groups connected to a silicon atom with the functional layer:

—Cl;

—OCH₃; and

—OH.

12. A display apparatus, comprising the quantum dot light emitting device according to claim 1.

13. A manufacturing method of the quantum dot light emitting device according to claim 1, comprising:
- providing a base substrate;
- forming a functional layer on a side of the base substrate;
- forming a connecting layer on a side, facing away from the base substrate, of the functional layer, wherein the connecting layer comprises: a ring molecule, a first structure connected with the ring molecule, and a connecting structure connecting the first structure and the functional layer;
- forming a quantum dot film on a side, facing away from the functional layer, of the connecting layer, wherein the quantum dot film comprises: a quantum dot, an anionic ligand, and a linking group linking the quantum dot and the anionic ligand; and
- treating the quantum dot film and the connecting layer under preset conditions to form a patterned quantum dot film layer.

14. The manufacturing method according to claim 13, wherein the first structure comprises a structure formed after a first photocurable group and a second photocurable group are cross-linked with each other by ultraviolet radiation, the first photocurable group is connected to the ring molecule, and the second photocurable group is connected to the connecting structure; and the treating the quantum dot film and the connecting layer through the preset conditions to form the patterned quantum dot film layer comprises:
- shielding a region where the quantum dot film is removed, and performing ultraviolet irradiation to make the first photocurable group and the second photocurable group of an irradiated region cross-linked, so as to reserve a quantum dot film in the irradiated region;
- wherein the forming the connecting layer on the side, facing away from the base substrate, of the functional layer comprises:
- forming a first sub-connecting layer on the side, facing away from the base substrate, of the functional layer, wherein the first sub-connecting layer comprises the connecting structure and the second photocurable group connected with the connecting structure; and
- forming a second sub-connecting layer on a side, facing away from the functional layer, of the first sub-connecting layer, wherein the second sub-connecting layer comprises the ring molecule and the first photocurable group connected with the ring molecule;
- wherein after the quantum dot film and the connecting layer are treated under the preset conditions to form the patterned quantum dot film layer, the manufacturing method further comprises:
- reusing the first sub-connecting layer that is not removed from the shielded region as a first sub-connecting layer to manufacture a quantum dot film of a next emergent light color;
- wherein the first structure is a photodegradable group; and the treating the quantum dot film and the connecting layer under the preset conditions to form the patterned quantum dot film layer comprises:
- shielding a region where the quantum dot film is reserved and performing ultraviolet irradiation to decompose the photodegradable group in an irradiated region and disconnect the ring molecule from the connecting structure, so as to remove the quantum dot film in the irradiated region;
- wherein the forming the connecting layer on the side, facing away from the base substrate, of the functional layer comprises:
- forming the connecting layer comprising the ring molecule, the photodegradable group and the connecting structure on the side, facing away from the base substrate, of the functional layer.

* * * * *

UNITED STATES PATENT AND TRADEMARK OFFICE
CERTIFICATE OF CORRECTION

PATENT NO. : 12,289,943 B2
APPLICATION NO. : 17/465698
DATED : April 29, 2025
INVENTOR(S) : Dong Li et al.

Page 1 of 1

It is certified that error appears in the above-identified patent and that said Letters Patent is hereby corrected as shown below:

On the Title Page

Item (54) and In the Specification, Column 1, Lines 1-3, should read:
QUANTUM DOT MATERIAL, QUANTUM DOT LIGHT EMITTING DEVICE, DISPLAY APPARATUS AND MANUFACTURING METHOD Signed and Sealed this
Twenty-second Day of July, 2025

Coke Morgan Stewart
*Acting Director of the United States Patent and Trademark Office*